United States Patent [19]

Hanasawa et al.

[11] Patent Number: 4,721,916
[45] Date of Patent: Jan. 26, 1988

[54] METHOD FOR DIAGNOSING AN INSULATION DETERIORATION OF A POWER CABLE

[75] Inventors: Kazuhiko Hanasawa, Tokyo; Kenichirō Soma, Ibaraki; Kazuo Kotani, Hitachi, all of Japan

[73] Assignee: Hitachi Cable, Ltd., Tokyo, Japan

[21] Appl. No.: 833,604

[22] Filed: Feb. 27, 1986

[30] Foreign Application Priority Data

Apr. 19, 1985 [JP] Japan .................. 60-84723

[51] Int. Cl.⁴ ............................. G01R 31/02
[52] U.S. Cl. ................... 324/544; 324/520; 324/551
[58] Field of Search .......... 324/51, 54, 509, 520, 324/522, 541, 542, 544, 551, 554; 340/647, 649, 650

[56] References Cited

U.S. PATENT DOCUMENTS

| | | | |
|---|---|---|---|
| 2,077,357 | 4/1937 | Doolittle | 324/54 |
| 3,178,640 | 4/1965 | Jaster et al. | 324/54 |
| 3,211,998 | 10/1965 | Kidwell | 324/54 |
| 3,803,484 | 4/1974 | Gray | 324/54 |
| 3,821,640 | 6/1974 | Bahder et al. | 324/54 |
| 4,200,835 | 4/1980 | Anahara et al. | 324/51 |
| 4,200,836 | 4/1980 | Okada et al. | 324/51 |
| 4,206,398 | 6/1980 | Janning | 324/51 |
| 4,415,850 | 11/1983 | Sherwood | 324/51 |

FOREIGN PATENT DOCUMENTS 56-6604 4/1981 Japan .
58-76885 4/1983 Japan .

*Primary Examiner*—Gerard R. Strecker
*Attorney, Agent, or Firm*—Lowe, Price, LeBlanc, Becker & Shur

[57] ABSTRACT

A method for diagnosing an insulation deterioration of a power cable comprising a step of measuring a DC current component in the AC voltage applied to said power cable, by using a filter circuit for cutting off an AC current and a DC current measuring apparatus for measuring small magnitude of DC current. According to the present invention, said filter circuit and said DC current measuring apparatus are joined in parallel each other and connected between a power source and one end portion of said power cable to be diagnosed. The DC current measuring apparatus can detect the polarity, magnitude, and time lapse characteristics of said DC current component for analyzing and estimating the insulation deterioration.

4 Claims, 6 Drawing Figures

METHOD FOR DIAGNOSING AN INSULATION DETERIORATION OF A POWER CABLE

BACKGROUND OF THE INVENTION

This invention relates to a method for electrically determining the existence of insulation deterioration of a power cable system, and specifically to a novel and unobvious method for diagnosing the insulation deterioration caused by the absorption of moisture into the solid insulation material.

Insulation deterioration of a power cable insulated with rubbers or plastics, for example, a polyethylene covered overhead power cable (hereinafter referred as CV cable) is evidently induced by water trees. Therefore, it is important to know of the generation of the water trees to prevent dielectric breakdown caused by insulation deterioration in the dielectric characteristics of the CV cable.

In the prior art, two methods for detecting the presence of water trees are known. A first method consists of sampling a portion of the insulation from an inactive cable in which a dielectric breakdown has occurred, boiling or dying the sample, and visually inspecting the sample directly by eye or with an optical microscope. The second method consists of applying a DC voltage to an inactive cable, measuring the charging current stored in the cable after application of the voltage, and estimating the generation of water trees in accordance with the result measured.

According to these methods, the water trees are detected in an inactive cable under no load conditions since dielectric breakdown of a cable cannot be detected reliably beforehand in an actually working power line system. Other known methods include testing a dielectric strength by applying a high AC or DC voltage to a power cable, and a method for measuring DC leakage current by applying a DC voltage thereto. The former, which is of a destructive method, may induce a dielectric breakdown by the test itself depending upon the degree of prior insulation deterioration. On the other hand, even though breakdown does not occur, it is possible that the test itself may cause the insulation characteristics to further deteriorate. The latter method is generally used to measure the mean insulation resistance over the entire length of the cable as indicated by the magnitude of the leakage current, and to observe pulse current generated intermittently in the defective portion thereof (called Kick Phenomenon). A disadvantage, however, is that the method necessitates the use of a high DC voltage generator and that even nondefective cable may be subject to possible damage by a steep and unusual voltage which is generated when a flash-over or a dielectric breakdown occurs. Another problem with such methods is due to differences between the AC voltage present during normal cable use and the DC voltage used for the test, including a significant difference in the electric field produced so that the test is not regarded to be a characteristic check under the electric field in accordance with the application of a commercial AC voltage.

Recent research teaches that the magnitude of leakage current is greatly effected depending upon the polarity of the DC voltage when the water tree arises in the insulation and the electrodes are arranged asymmetrically. This phenomenon results in the false estimation of insulation deterioration due to the change in magnitude of the current.

In consideration of the above, a method is proposed for checking the cable which comprises applying an AC voltage to a cable undergoing testing, detecting the DC current component of the current through the grounding line, analyzing the polarity, magnitude, and time lapse characteristics of the DC current, and finally detecting the existence, magnitude and growth direction of the water tree in the cable insulation.

Observing water trees in one hundred specimens of 6 KV class-CV cables, having effective lengths of 10 m and wherein the actual working voltage of 3.8 KV for the CV cable was applied to the conductor, the DC current component was detected from the outer shielding of the cable, and AC breakdown was carried out in each specimen. The results are shown in FIGS. 1 to 3.

FIG. 1 shows the relationships between the percentage volume of the water trees observed in the cable insulation and the DC current component through the grounding line per $1m^3$ expressed as microamperes per cubic meter ($\mu A/m^3$). The component is measured in units of $\mu A/m^3$ to normalize measurements for cable specimens having different conductor sizes. In FIG. 1, curve A indicates the water tree generated from the conductor shield of the cable, and the curve B indicates the water tree generated from the insulation shield of the cable. It can be seen from these curves that the larger the DC component of the cable, the more the water tree occupies the remarkable portion of the insulation in its volume.

FIG. 2 shows the relationships between the occupied volume of the water tree in the cable insulation and the maximum lengths of the water tree from conductor shields and the water tree from insulation shield. This indicates that the larger the volume the water trees occupied in the cable insulation, the larger the maximum length of the water tree becomes.

FIG. 3 shows the relationships between the AC breakdown voltage of the cable and absolute value of the DC current component expressed in $\mu A/m^3$. From FIG. 3, it is seen that the larger the magnitude of the DC current component of the cable, the more the AC breakdown voltage is lowered.

From the above, we can conclude the following:
(1) The DC current component is generated by the existence of the water tree. When the water tree from conductor shield is generated, the polarity of the DC current component is negative, and when the water tree from insulation shield is generated, the polarity of the DC current component is positive.
(2) The larger the magnitude of the DC current component, the larger the volume occupied in the cable insulation by the water tree.
(3) The larger the magnitude of the DC component, the longer is the water tree generated.

FIGS. 4 and 5 show examples for preventing dielectric breakdown of a working cable by detecting the existence, magnitude, and growth direction of a water tree considering the polarity and magnitude of the DC current component. FIG. 4 illustrates an example of a CV cable with three cores, and FIG. 5 three CV cables each having a single core.

In FIGS. 4 and 5, a power source transformer 1, high voltage bus lines 2, a grounding transformer 3, CV cables to be diagnosed 4, 4', grounding line 5, 5' connected to the metal shield layer of the cable, and an apparatus for measuring the DC current component are shown.

The apparatus 6 comprises a filter circuit, amplifying circuits, processing circuits, and displaying circuits. The above systems can detect the existence, magnitude, and direction of growth of a water tree by observing the DC component of the current through grounding lines 5 or 5' which are connected to the metal shield layer of the CV cable 4 or 4' to which the AC voltage is applied from bus lines 2. Therefore, the apparatus can be useful for the detection of the water tree not only in a working cable under live conditions, but in an inactive or removed cable.

It was found however, that the above described apparatus was not suitable for use with all cable systems. That is, high voltage cables used in power line systems have plural grounding points at their terminal ends or along the insulation shield thereof. Further, some power cables have an outer shielding layer which is in direct contact with earth ground. In such ground cables, interrupting the grounding means for inserting the apparatus thereinto becomes difficult necessitating the use of another measurement procedure.

As electric power is of critical importance, the sudden interruption of electricity caused by dielectric breakdown of a power cable poses a community problem. According to the present invention, the prior art disadvantages and inconveniences in the diagnosis of insulation deterioration for power cables are substantially eliminated. Therefore, the present invention provides a method for diagnosing power cables to predict dielectric breakdown thereof, and to provide additional warning and time for the replacement or repair of the power line system. As explained above, the present invention is useful not only to the power industry but to our whole society as well.

SUMMARY OF THE INVENTION

In accordance with the present invention, a new and unobvious method is disclosed for diagnosing an insulation deterioration of a power cable.

The present invention provides a significant advantage in that the deterioration of the insulation may be detected by measuring a DC current component present together with any AC voltage present without regard to grounding system structure.

In accordance with the present invention, a method is described for diagnosing an insulation deterioration of a power cable which uses first means for filtering an AC charging current and second means connected in parallel with the first means for measuring a small DC current component whereby the polarity and magnitude of the DC current component are indicative of the condition of the insulation.

In accordance with an aspect of the present invention, DC current measuring apparatus can transmit, via an optical fiber or tree space, an optical signal corresponding to the DC current component whereby a condition of the insulation deterioration can be determined without physically approaching the dangerous high voltage area.

In accordance with another aspect of the present invention, a bypass circuit is provided to electrically bypass around the filter and associated circuits so as not to be subjected to any surge current generated upon switching on the power source. The bypass path is opened after the switching surge dissipates while charging current begins to flow in the cable providing for the measurement of DC current component.

Accordingly, it is an object of the present invention to provide a method for diagnosing an insulation deterioration of a power cable.

It is another object of the present invention to provide a method for diagnosing an insulation deterioration of a power cable by measuring a very small DC current component present with the AC voltage.

It is a still another object of the present invention to provide a method for diagnosing an insulation deterioration of a power cable by analyzing the polarity and magnitude of the DC current.

It is yet another object of the present invention to provide a remote sensing device wherein an optical signal corresponding to the DC current component detected in the DC current measuring apparatus is transmitted thereby avoiding the danger associated with approaching a high voltage area.

It is a further object of the present invention to provide a system for diagnosing an insulation deterioration of a power cable including a bypass circuit for eliminating the effects of a surge current generated during application of the power source.

These and other objects of the present invention will become apparent in conjunction with the following description and drawings which are included for illustration purposes only.

DESCRIPTION OF THE PREFERRED EMBODIMENT

Figure 1:
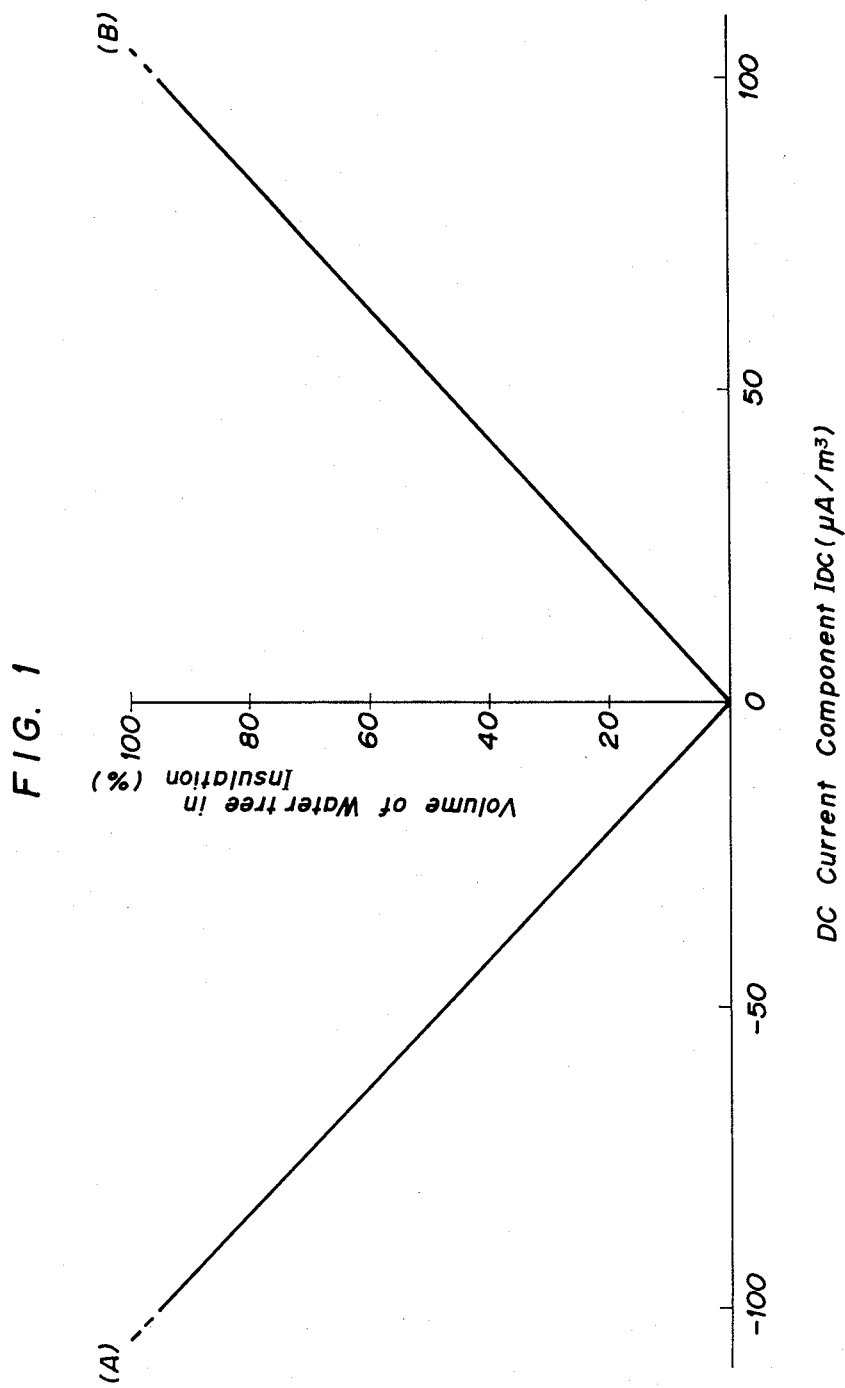
FIG. 1 is a curve showing a relationship between the DC current component in cable insulation expressed in terms of $\mu A/m^3$ and the volume of the water tree occupied in the insulation undergoing examination.
Figure 2:
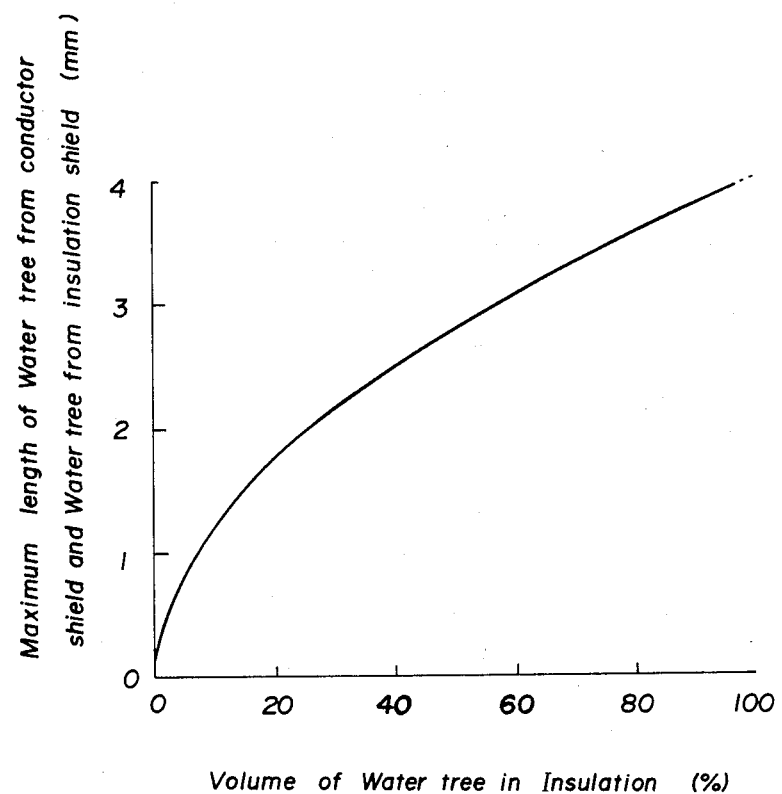
FIG. 2 is a graph indicating the relationship between the maximum length of the water tree from conductor shield and the water tree from insulation shield and the volume of the water tree occupied in the insulation to be diagnosed.
Figure 3:
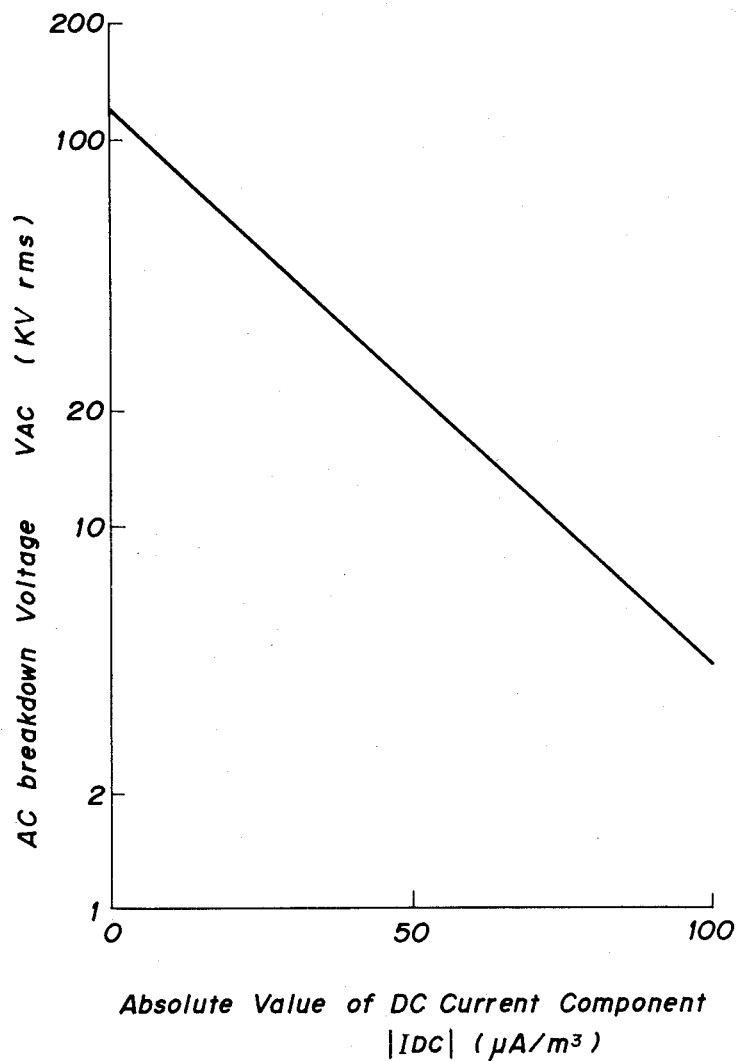
FIG. 3 shows a curve indicating a relationship between the absolute value of the DC current component in a cable insulation expressed as $\mu A/m^3$ and the AC breakdown voltage of the cable.
Figure 4:
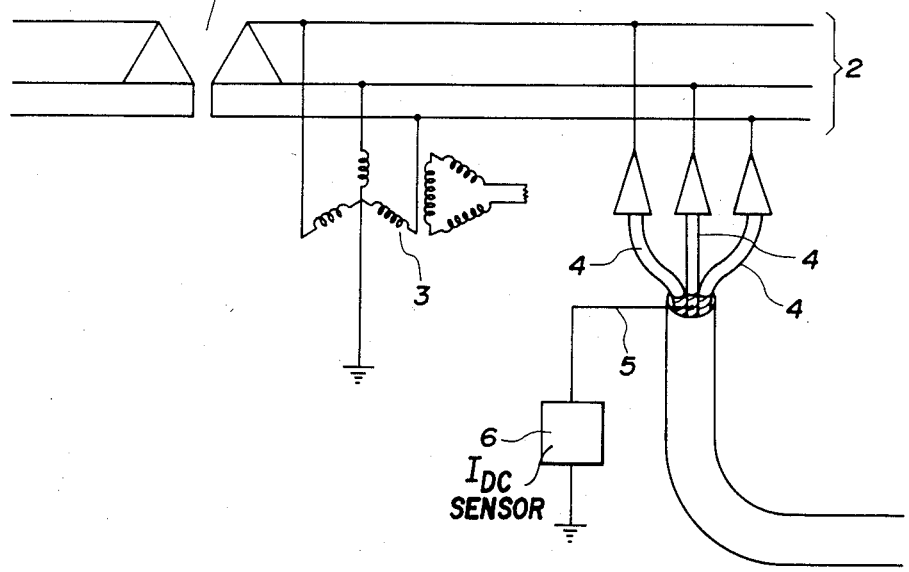
FIGS. 4 and 5 depict prior methods of testing power cable insulation.
Figure 5:
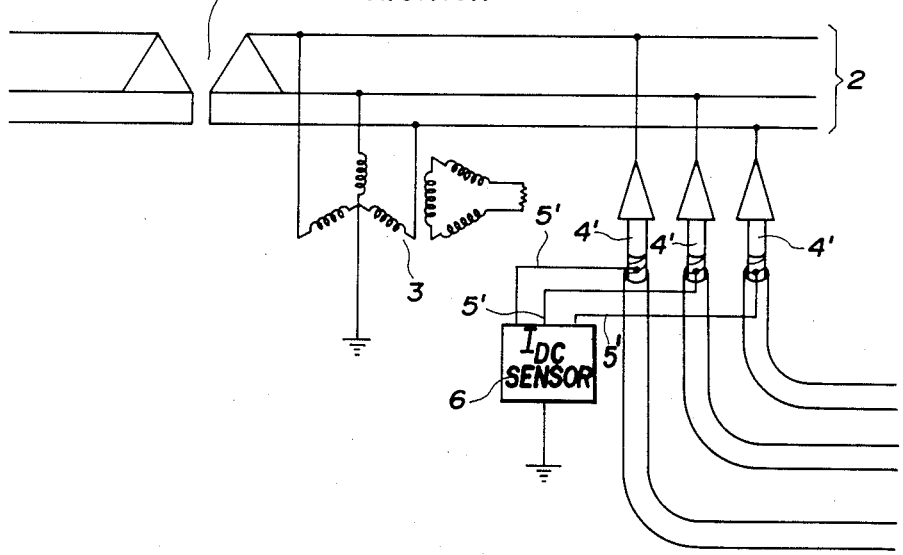
Figure 6:
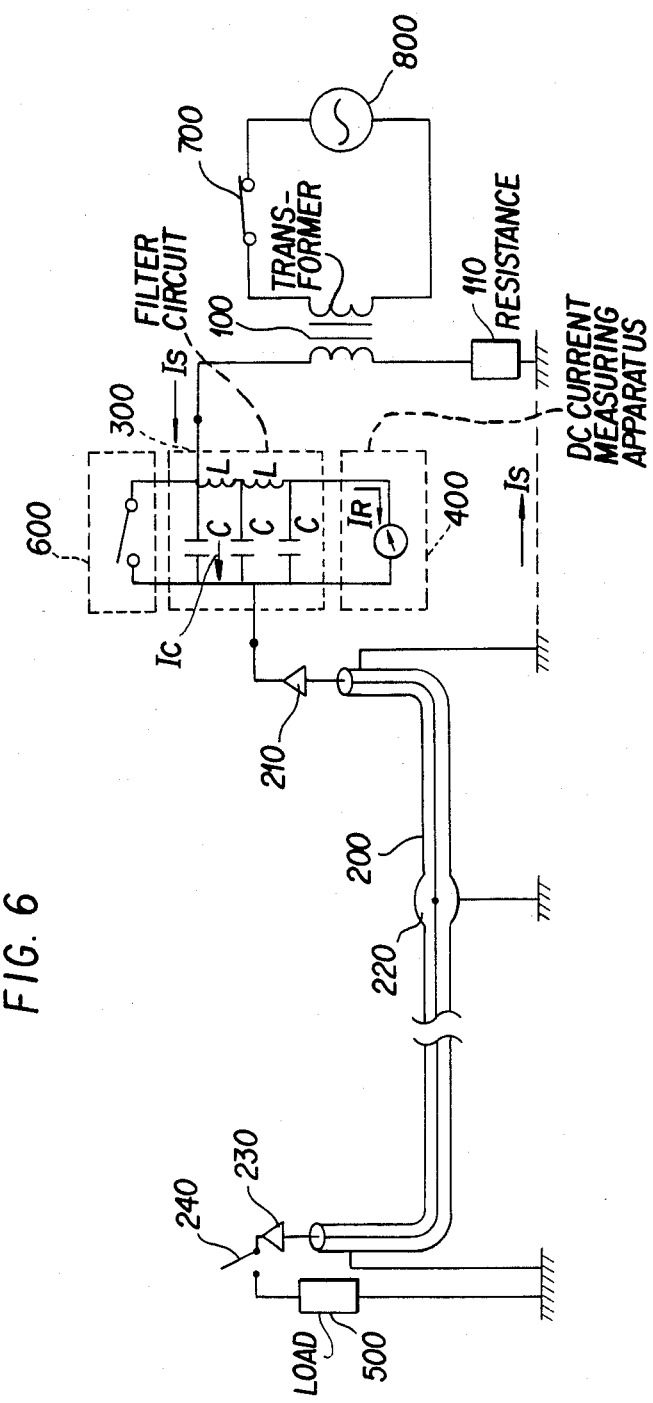
FIG. 6 is a circuit diagram for explaining a method for diagnosing an insulation deterioration of a power cable in accordance with the present invention.

Referring now to the drawings, shown in FIG. 6 is a system in accordance with the present invention for detecting an insulation deterioration of a power cable.

In FIG. 6, filter circuit 300 has DC blocking capacitors C and AC blocking coils L for passing only the DC current component to apparatus 400 which is connected in parallel with circuit 300 for measuring a small DC current. Filter circuit 300, DC current measuring apparatus 400, and bypass switch 600 are interconnected between AC power source 800, switch 700 and transformer 100, and one end of a CV cable system 200 through cable terminal 210. The outer metal shield of cable system 200 is grounded at both ends at cable splices or junctions 220. Another end of the CV cable system 200 (when the cable system has multiple branches, the end portion is plural) is generally connected to a power load 500 through cable terminal 230, which is disconnected via switch 240 before the measurement, so that only the current Is corresponding to the charging current will flow from power source transformer 100 to the cable 200.

Although it is theoretically acceptable to keep load 500 connected, it is not practical because filter circuit 300 becomes unnecessarily large. The charging current Is consists of pure AC charging current Ic and the DC current component $I_R$ corresponding to the deterioration of the insulation. The AC charging current Ic passes through the filter circuit 300 while only the DC current component $I_R$ passes through measuring apparatus 400. As the neutral point of the transformer 100 is connected directly or via reactance or resistance 110 to ground, current Is corresponding to the charging current flows in the direction shown by the arrow in the drawing.

In order to make it possible to determine the deterioration of a cable in accordance with the result of the diagnosis of an energized cable, fifteen 6 KV underground lines were selected to be tested. All fifteen were to be replaced due to the long term use of more than 15 years.

The measuring results were as follows.

(a) A DC current component of 2 nA to 20 μA was detected in five lines among fifteen lines. As to the polarity thereof, positive in three lines, negative in one line, and both positive and negative in one line.

(b) Stray current was larger in fluctuation than DC current component. The magnitude thereof ranges several μA to several hundred μA and was larger than that of DC current component.

(c) The magnitude and polarity of DC current component were identical even if the measuring point was changed from one side of the cable to another side thereof.

(d) In one case the measurement of the DC current component was impossible when grounding was not perfect.

In order to study the relation between the measuring results of an energized cable and the deterioration thereof, the experiment was carried out after removing the cable from the installation site. That is, the measurement of DC current component was carried out at test facility. In the experiment, the DC current component was measured in each phase and three phases together under the application of 38 KV AC. The results were identical to those obtained with the energized cable except for one specific line having an abnormal sheath.

The study of the deterioration of a cable is summarised as follows.

(1) The generation of water tree

Visual observation was made in respective portions where DC current component was detected and where no DC current component was detected. Further, pieces of insulation corresponding to a breakdown aperture or vicinity thereof were observed by dyeing and inspection with an optical microscope after AC breakdown test was carried out. The results were as follows.

(a) In all of the cables in which DC current component was more than 2 nA, a water tree was found. This means that there is a correlation between the magnitude of DC current component and the length and generation density of a water tree.

(b) In cables in which DC current component was less than 1 nA, no water tree was found by visual observation. However, water trees having a maximum length of 2 mm were found in some of the cables when observation was made using a microscope as in item (a).

(2) AC breakdown voltage (a) In cables in which the DC current component was more than 2 nA, on average the breakdown voltage was found to be lowered to 15 to 40% of the initial value thereof.

(b) In cables in which DC current component was less than 1 nA, breakdown voltage was 70 to 90% of the initial value thereof.

In the above embodiment, the elements like cable, transformer and so on are shown for a single phase system. However, it is apparent that the present invention can apply to each phase of a multiple-phase power line whereby the diagnosis of the insulation deterioration can be made in a cable of each phase.

Filter circuit 300 can be connected to a plurality of cables for simultaneous detection of insulation faults, provided that the capacity of the circuit inserted into the line system is acceptable in regard to the rate of the cables. In such a case, only when the deterioration of the insulation is expected to have occurred in any of the cables is the diagnosis carried out in each cable separately to determine in which of the cables has the deterioration in the insulation occurred.

The diagnosis procedure comprises the steps of switching off an AC power source, disconnecting the load from the terminals of a cable end or the like, connecting a filter circuit and a DC current measuring circuit to the other end of the cable, and then measuring the DC current component after switching on the AC power source. As this switch-on operation induces a switching surge current which produces an unusually high voltage in the filter circuit or the like, the capacity of the capacitors in the filter circuit must be sufficient to withstand such voltage. Therefore, the filter circuit tends to become physically large in size. According to the present invention, for minimizing the size of the filter circuit, it is preferable to provide bypass circuit 600 which short circuits around the filter circuit and the like when the power source is switched on, while the short circuit is opened after the switching surge dissipates whereby the stable charging current begins to flow in the cable for the diagnosis of the cable insulation.

It will be apparent to those skilled in the art that various changes and modifications may be made within the spirit of the above teachings. Also, in view of the above, the present invention may be embodied in other specific forms without departing from the spirit or essential attributes thereof and, accordingly, reference should be made to the appended claims, rather than to the foregoing specification as indicating the scope of the invention.

What we claim is:

1. A method for diagnosing an insulation deterioration of a power cable having AC charging current supplied to one end thereof from a power source comprising the steps of, detecting between said power source and said one end of said power cable a DC current component caused by the insulation deterioration and which is contained in said AC charging current flowing into said power cable through said one end portion thereof from said power source, measuring the polarity and magnitude of said DC current component, and estimating the insulation deterioration of said power cable as a function of said polarity and magnitude of said DC current component.

2. A method for diagnosing an insulation deterioration of a power cable according to claim 1, wherein said DC current component is separated from said AC charging current by means which is provided between said one end portion of said power cable and said power source.

3. A method for diagnosing an insulation deterioration of a power cable according to claim 2, wherein said means comprises capacitors for passing purely AC charging current and blocking coil for passing only DC current component based upon the deterioration of the cable insulation of said power cable.

4. A method for diagnosing an insulation deterioration of a power cable according to claim 2 further comprising, forming a short circuit bypassing said means for separating said DC current component from said AC charging current when said power source is turned on, and disconnecting said short circuit from said separating means after any surge current has dissipated.

* * * * *

UNITED STATES PATENT AND TRADEMARK OFFICE
CERTIFICATE OF CORRECTION

PATENT NO. : 4,721,916

DATED : January 26, 1988

INVENTOR(S) : Kazuhiko Harasawa, et al

It is certified that error appears in the above-identified patent and that said Letters Patent is hereby corrected as shown below:

On the title page, Item [19] "Hanasawa" should read --Harasawa, et al--.

The spelling of the first named inventor to read as follows;

--Kazuhiko Harasawa--.

Signed and Sealed this

Third Day of July, 1990

*Attest:*

HARRY F. MANBECK, JR.

*Attesting Officer*      *Commissioner of Patents and Trademarks*